United States Patent

Kim

[11] Patent Number: 5,994,155
[45] Date of Patent: Nov. 30, 1999

[54] METHOD OF FABRICATING A THIN FILM TRANSISTOR LIQUID CRYSTAL DISPLAY

[75] Inventor: Byung Ku Kim, Kyungki-do, Rep. of Korea

[73] Assignee: Goldstar Co., Ltd., Seoul, Rep. of Korea

[21] Appl. No.: 08/665,739

[22] Filed: Jun. 18, 1996

Related U.S. Application Data

[62] Division of application No. 08/375,644, Jan. 20, 1994, Pat. No. 5,604,358.

[51] Int. Cl.$^6$ .............................. H01L 21/00; H01L 21/84
[52] U.S. Cl. ............................................... 438/30; 438/158
[58] Field of Search ....................... 438/30, 158; 257/59, 257/61

[56] References Cited

U.S. PATENT DOCUMENTS

| 5,631,473 | 5/1997 | Possin et al. | 257/59 |
| 5,652,633 | 7/1997 | Lee | 349/42 |
| 5,677,547 | 10/1997 | Kodaira et al. | 257/59 |
| 5,691,787 | 11/1997 | Shimada et al. | 349/40 |

FOREIGN PATENT DOCUMENTS

| 266252 | 5/1988 | European Pat. Off. . |
| 6118442 | 4/1994 | Japan . |

*Primary Examiner*—John F Niebling
*Assistant Examiner*—Richard A. Booth
*Attorney, Agent, or Firm*—John P. White; Cooper & Dunham LLP

[57] ABSTRACT

A thin film transistor LCD and a fabricating method therefor.

The thin film transistor LCD includes, a plurality of gate lines each having a projection part formed spaced in a certain interval on a transparent substrate; a plurality of first data lines each formed covering one side of each of the projection parts of the gate lines for serving as drain electrodes; a plurality of second data lines each formed on the transparent substrate to cross the gate lines at a right angle to the gate lines in parts other than the projection parts but formed discrete so as to be intermittent to each other at parts crossing the gate lines; an insulation layer having at least one contact hole on each of the intermitted pieces of the second data lines formed on all over the surfaces of the first and the second data lines, the gate lines and the transparent substrate; and, a plurality of third data lines formed on the insulation layer to cover the other side of the projection parts and to connect the intermitted pieces of the second data lines through making contact with the contact holes for serving as source electrodes together with the second data lines.

2 Claims, 6 Drawing Sheets

METHOD OF FABRICATING A THIN FILM TRANSISTOR LIQUID CRYSTAL DISPLAY

This application is a divisional of U.S. Ser. No. 08/375,644, filed Jan. 20, 1994, now U.S. Pat. No. 5,604,358.

FIELD OF THE INVENTION

This invention relates to a thin film transistor LCD and a fabricating method for the thin film transistor LCD.

DESCRIPTION OF THE PRIOR ART

Conventional TFT LCDs(Thin Film Transistor Liquid Crystal Display) have problems in that they cause vertical cross talks as well as horizontal cross talks.

The vertical cross talk is caused in case data lines and a pixel electrode of a TFT LCD are formed on the same layer.

That is, it is caused because, at operation of the TFT LCD, voltages applied to the data lines(i.e., source and drain lines of a thin film transistor) affect a voltage applied to the LCD pixel electrode. In other words, it is caused due to an electrostatic coupling between the data lines and the pixel electrode.

The horizontal cross talk is also caused in case the data lines and the pixel electrode of the TFT LCD are formed on the same layer (on the same height).

As well known, the TFT LCD is fabricated by putting a upper plate having the common electrode and a lower plate having the data lines and a pixel electrode together.

Therefore, when the data lines and the pixel electrode are formed on the same height, a voltage charged between the common electrode and the pixel electrode is changed due to a capacitance developed between the common electrode on the upper plate and the data lines on the lower plate.

Due to this voltage change, an image displayed on the TFT LCD screen is dimmed in horizontal direction.

Such a phenomena is called as 'cross talk'.

FIG.1 is a schematic illustration showing relation of array between gate lines and data lines for conventional TFT LCDs, showing a plurality gate lines 2 formed on a transparent substrate 1 spaced in a fixed interval and a plurality of data lines 8 formed spaced in a fixed interval at a right angle to the gate lines 2.

Herein, one thing remarkable is that the data lines 8 are continuous even at points crossing the gate lines 2.

An arrangement and a fabricating method of the conventional thin film transistor LCD are to be explained hereinafter. Shown in FIG. 2 is a plan view for explaining an arrangement of one pixel region of the conventional TFT LCD. Shown in FIG. 2 corresponds to the one pixel region R1 of FIG. 1, and only which one pixel region will be explained for convenience sake.

As well known, one pixel region R1 of a TFT LCD includes one TFT and one pixel electrode.

One TFT includes one gate line and two data lines(source and drain lines).

Referring to FIG. 2, a gate line 2 is formed on a transparent substrate 1, an active layer 4 is formed on the gate line 2, a first data line(or a source electrode) 7 is formed on one side of the active layer 4 covering a part of the active layer 4, a second data line(or a drain electrode) 8 is formed on the other side of the active layer 4 covering a part of the active layer 4, and a pixel electrode 6 is formed on the one side of the first data line 7 covering a part of the first data line 7.

That is, the conventional TFT LCD has an arrangement wherein the data line 7 and the pixel electrode 6 formed on the same layer(same height) and the gate line 2 formed under the data line 7 and the pixel electrode 6.

FIGS. 3A to 3E are sections across line A–A' of FIG. 2 showing processes for fabricating a TFT-LCD having a plan view like FIG. 2.

Referring to FIGS. 3A to 3E, processes for fabricating a conventional TFT-LCD is to be explained hereinafter.

First, as shown in FIG. 3A, a gate line(or a gate electrode) 2 having a projection part 2a is formed by depositing metal on a transparent substrate 1 and subjecting it to a photo/etching process, and as shown in FIG. 3B, an insulation film 3 for insulating the gate line 2 is formed on all over the exposed transparent substrate 1 and the gate line 2.

Then, as shown in FIG. 3C, after forming an amorphous silicon for forming an active layer and an n+ type amorphous silicon for forming an ohmic contact on all over the insulation layer 3 successively, by subjecting them to a patterning together, i.e., by subjecting them to a photo process and an etching process together, an active layer 4 and an n+ type amorphous silicon pattern 5 having a breadth wider than the projection part 2a of the gate line 2 respectively are formed over the projection part 2a.

Then, as shown in FIG. 3D, a pixel electrode 6 is formed on a part of the insulation layer 3 spaced a certain distance from one side of the active layer 4 through forming a transparent insulation layer(for example, an ITO:Indium Thin Oxide) on all over the exposed surface and subjecting it to a patterning.

Then, as shown in FIG. 3E, the first data line (or the drain electrode) 7 is formed on an area covering from a part of one side of the active layer 4 to a part of the pixel electrode 6 and the second data line (or the source electrode) 8 is formed on an area covering from a part of the other side of the active layer 4 to a part extending in a direction at a right angle to the gate line 2 through depositing metal on all over the exposed surface and subjecting it to a patterning process, i.e., to a photo process and an etching process.

Then, the ohmic contact layer 5a is completed by removing with etching the exposed n+ amorphous silicon pattern 5 between the first data line 7 and the second data line 8 using the etch mask used at forming the first data line 7 and the second data line 8.

Finally, a protection insulation layer 9 is formed on all over the exposed surfaces of the first data line 7, the second data line 8, the active layer 4, and the pixel electrode 6.

As can be seen from the foregoing description, the conventional TFT LCD has following problems.

First, vertical cross talk is liable to occur because the data lines and the pixel electrode of the TFT on the lower plate are formed on the same layer (i.e., on the same height), which make them to affect each other.

Second, picture quality of the LCD is degraded due to occurrence of horizontal cross talk coming from a capacitance developed between the common electrode formed on the upper plate and the data lines formed on the lower plate.

SUMMARY OF THE INVENTION

The object of this invention devised to solve the problems of conventional technology is to provide a TFT LCD and a fabricating method therefor, which can reduce the vertical and the horizontal cross talks by forming the data lines and the gate line on the same layer.

These and other objects and features of this invention can be achieved by providing a thin film transistor liquid crystal display, including a plurality of gate lines each having a projection part formed spaced in a certain interval on a transparent substrate, a plurality of first data lines each formed covering one side of each of the projection parts of the gate lines for using as drain, a plurality of second data lines each formed on the transparent substrate to cross the gate lines at a right angle to the gate lines in parts other than the projection parts but formed discrete so as to be intermittent to each other at parts crossing the gate lines, an insulation layer having at least one contact hole on each of the intermitted pieces of the second data lines formed on all over the surfaces of the first and the second data lines, the gate lines and the transparent substrate, and a plurality of third data lines formed on the insulation layer to cover the other side of the projection parts and to connect the intermitted pieces of the second data lines through making contact with the contact holes for serving as sources together with the second data lines.

DETAILED DESCRIPTION OF THE INVENTION

In order to achieve the foregoing objects, this invention eliminates influences between the data lines and pixel electrodes and ensures insulation between the data lines and the common electrodes by forming data lines on a same layer, i.e., on a same height with the gate lines, thereby reducing the capacitance Csc.

Figure 4:
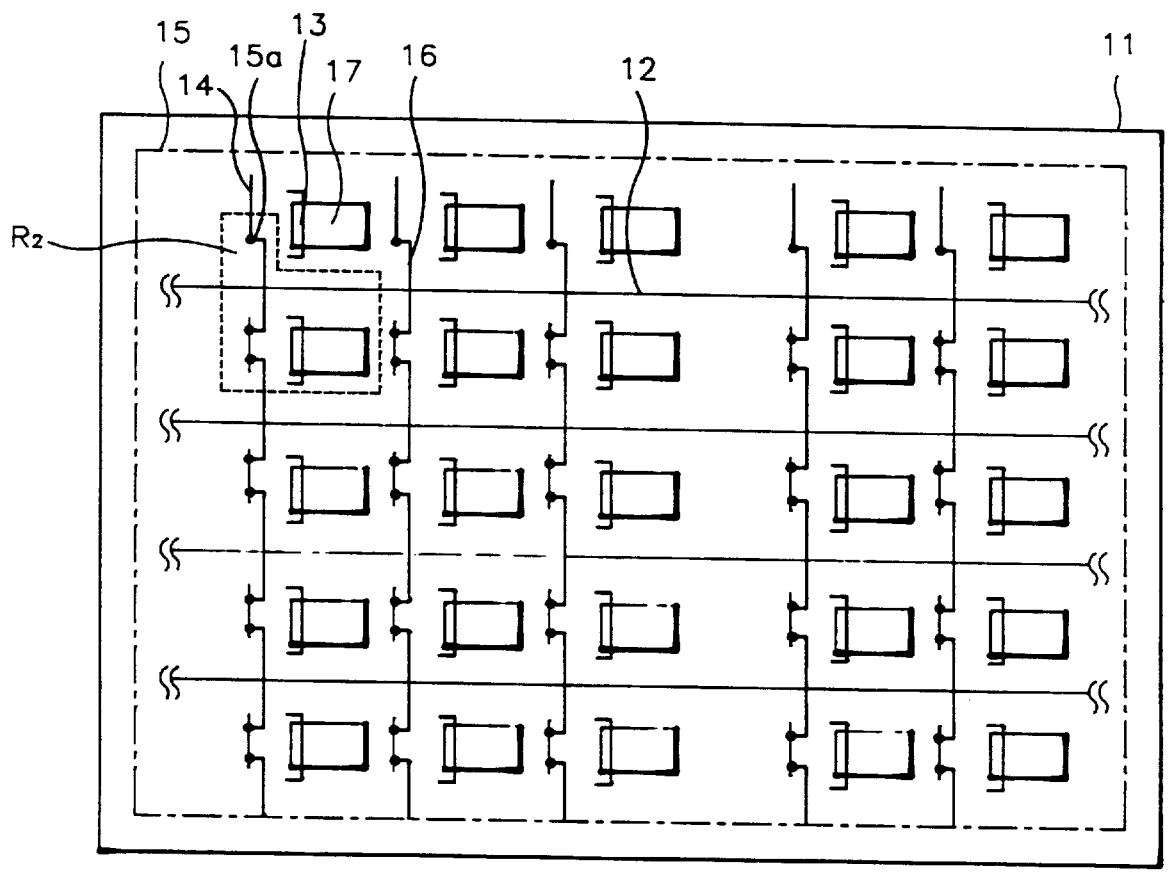
FIG. 4 is a schematic illustration showing relation of array between gate lines and data lines for TFT LCDs in accordance with this invention.
Figure 5:
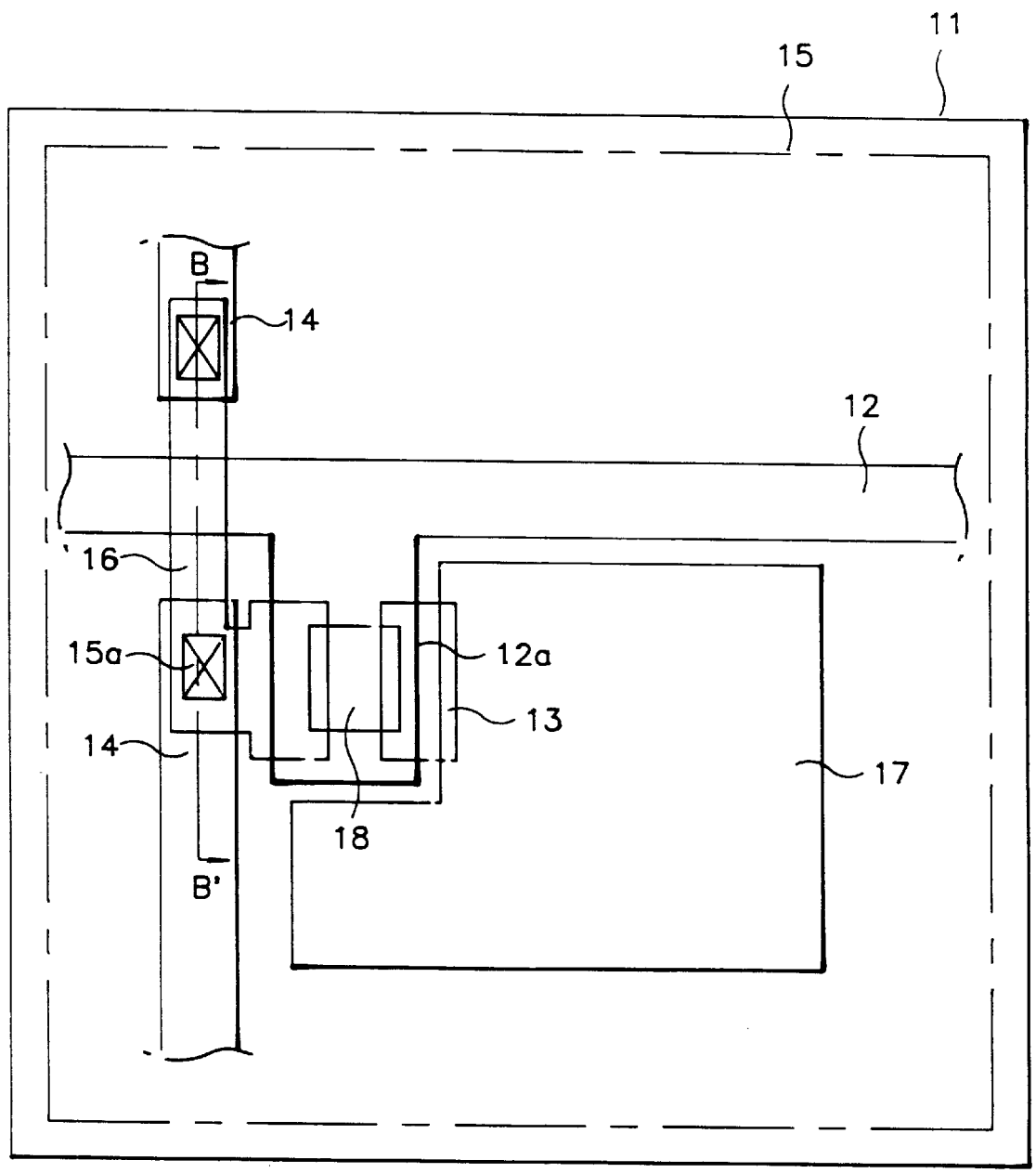
FIG. 5 is a plan view for one pixel region of FIG. 4.

A thin film transistor LCD and a method for fabricating the thin film transistor LCD in accordance with this invention are to be explained, referring to FIGS. 3 to 5.

FIG. 4 is a schematic illustration showing relation of array between gate lines and data lines for TFT LCDs in accordance with this invention.

According to FIG. 4, a plurality of gate lines 12 are formed spaced in a fixed interval on a transparent substrate 11, a plurality of first data lines 13 are formed at a right angle to the gate lines 12 discrete at parts crossing the gate lines 12, second data lines 14 are formed spaced a certain distance to the first data lines 13 so as to be 1:1 matched with the first data lines, a plurality of third data lines 16 formed above the second data lines 14 connecting between the second data lines 14.

Herein the reference numbers 15a, 15 and 17 are a contact hole, an insulation layer and a pixel electrode, respectively.

Figure 1:
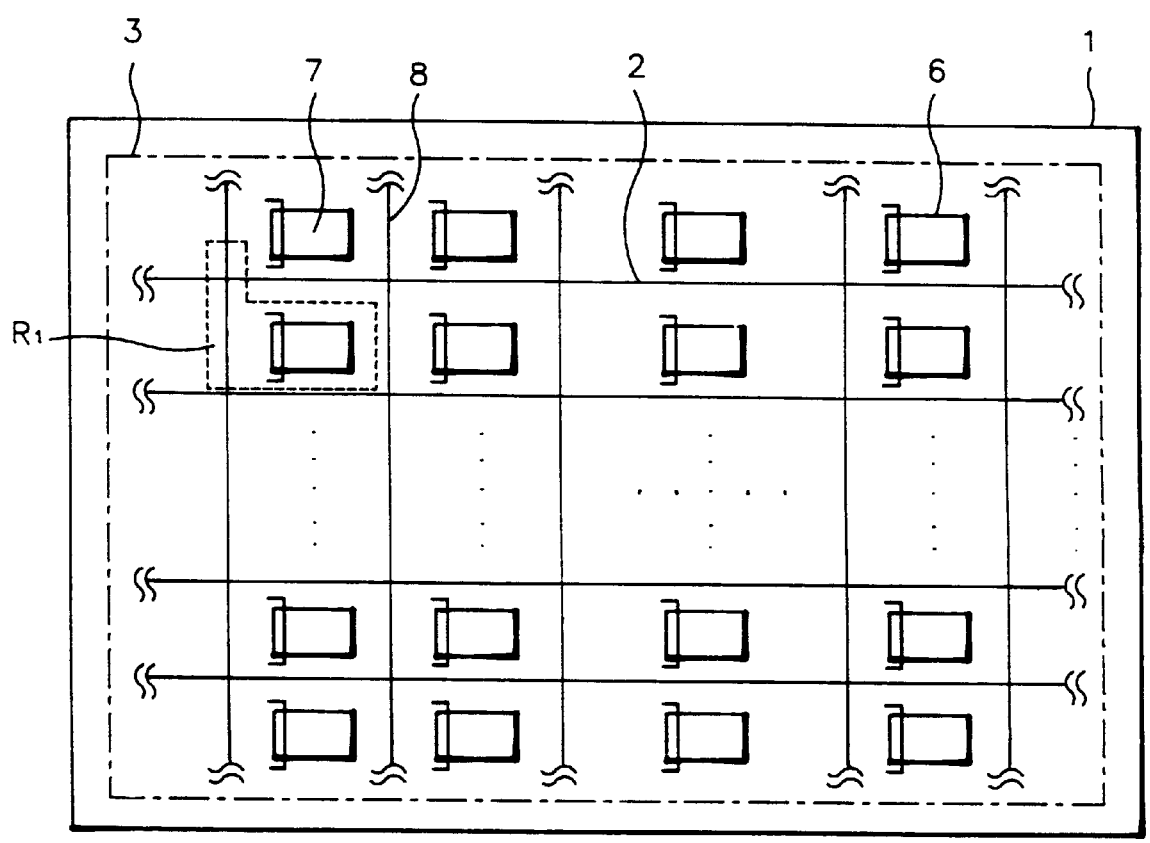
FIG. 1 is a schematic illustration showing relation of array between gate lines and data lines in conventional TFT LCDs.
Figure 2:
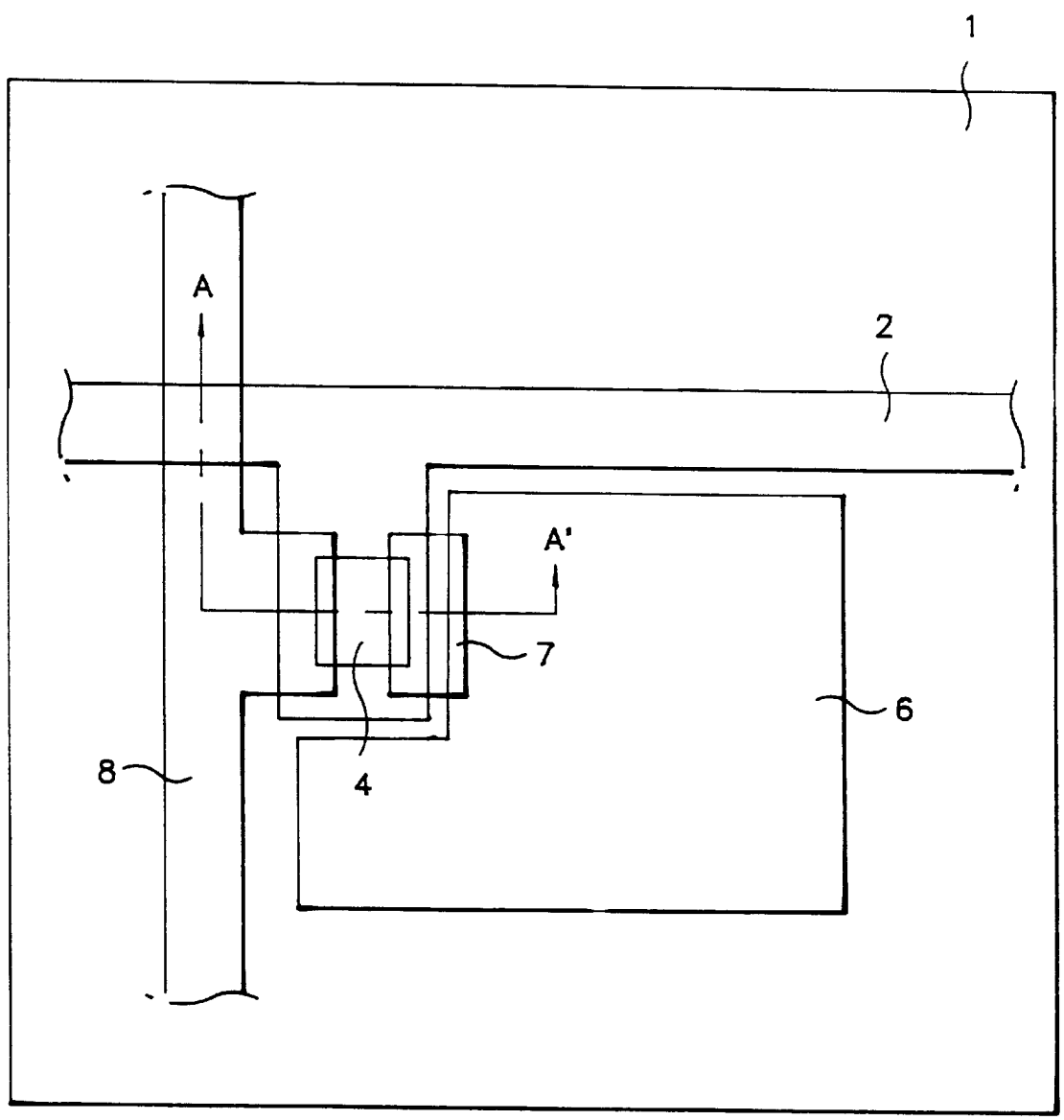
FIG. 2 is a plan view for one pixel region of FIG. 1.
Figure 3A:
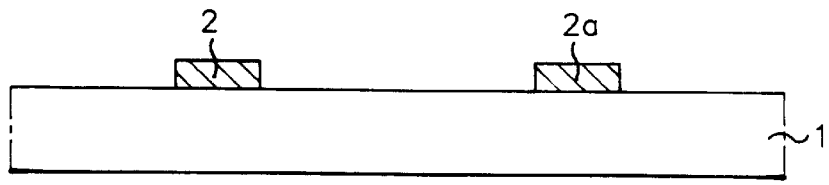
FIGS. 3A–3E are sectional views across line A–A' showing processes for fabricating the TFT LCD of FIG. 2.
Figure 3B:
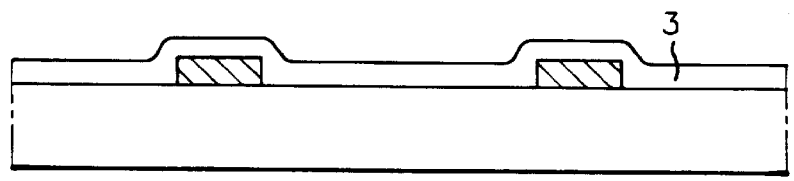
Figure 3C:
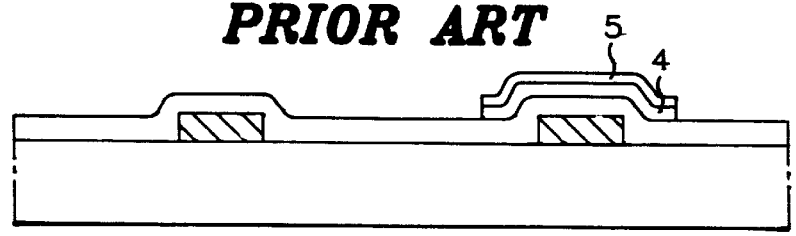
Figure 3D:
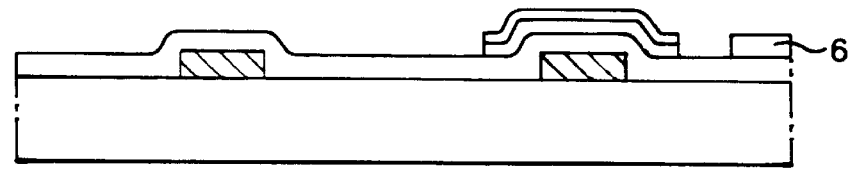
Figure 3E:
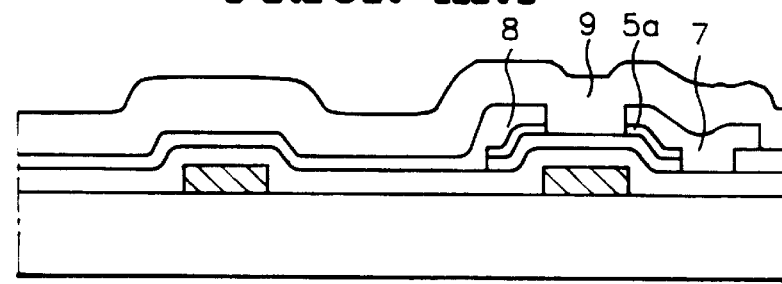

Referring to FIG. 5, when it is compared to the one pixel region R1 of the conventional TFT LCD shown in FIG. 2, remarkable thing is that a second data line 14 formed at a same position with a gate line 12 is discrete at the crossing point crossing the gate line 12.

FIG. 5 is a plan view for explaining an arrangement of one pixel region of the TFT LCD in accordance with this invention, corresponding to the one pixel region R2 of FIG. 4.

For convenience sake, only the one pixel region R2 is to be explained hereinafter for an example. The entire TFT LCD array is continuous and regular arrays of such one pixel regions R2.

According to FIG. 5, a gate line 12 having a projection part 12a is formed on a transparent substrate 11, a first data line 13 is formed covering one side of the projection part 12a of the gate line 12, one second data line 14 is formed on the substrate 11 to cross at a right angle to the gate line 12 at a part other than the projection part 12a but discrete at the crossing point, an insulation layer 15 having one contact hole on each of edges of the data line 14 on both sides of the gate line 12 at the crossing point is formed covering entire surfaces of the second data line 14, the transparent substrate 11, and the gate line 12 including the projection part 12a, a third data line 16 is formed on the insulation layer covering the other side of the projection part 12a of the gate lines 12 and connecting the discrete second data line 14 through making contact with the contact holes on both sides of the gate line 12 at the crossing point.

Herein, the reference numbers 17 and 18 are a pixel electrode and an active layer, respectively.

FIGS. 6A–6F are sectional views across line B–B' showing processes for fabricating the TFT LCD of FIG. 5.

Referring to FIGS. 6A–6F, processes for fabricating the TFT LCD in accordance with this invention are to be explained hereinafter.

Figure 6A:
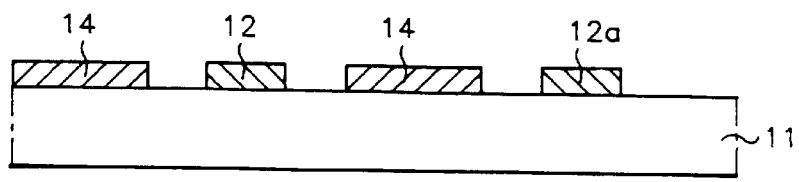
FIGS. 6A–6F are sectional views across line B–B' showing processes for fabricating the TFT LCD of FIG. 5.

First, as shown in FIG. 6A, the gate line 12 having the projection part 12a (see FIG. 5) together with the second data line 14 crossing the gate line 12 at a right angle at a part other than the projection part 12a but discrete at the crossing point are formed through depositing metal, such as aluminum(Al) or aluminum-tantalum(AlTa) on the transparent substrate 11 and subjecting it to a patterning, i.e., subjecting it to photo/etching processes.

Figure 6B:
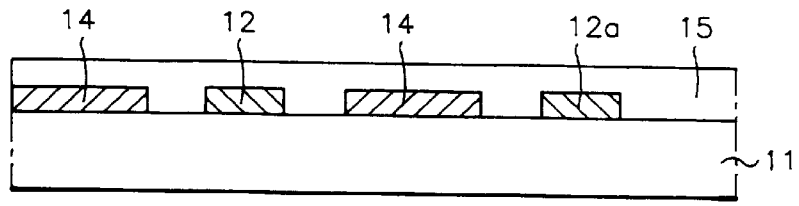

Then, as shown in FIG. 6B, the insulation film 15 such as an oxide film is formed on the entire exposed surfaces of the gate line 12 including the projection part 12a, the discrete second data line 14, and the transparent substrate 11.

Figure 6C:
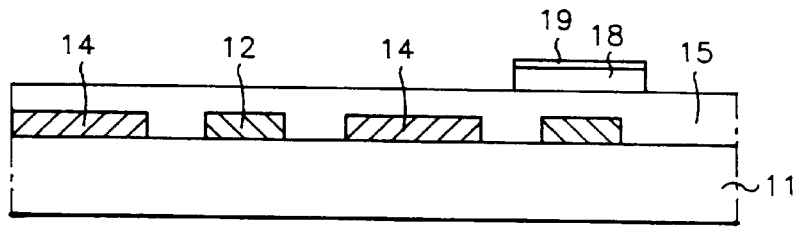

Then, as shown in FIG. 6C, after forming a semiconductor layer(for example, an amorphous silicon) for forming an active layer and a high density semiconductor layer(for example, an n+ conduction type amorphous silicon) for forming an ohmic contact on all over the exposed surface successively, by subjecting them to a patterning together, an active layer 18 and a high density semiconductor layer pattern 19 having a width wider than the projection part 12a respectively are formed on the insulation layer.

Figure 6D:
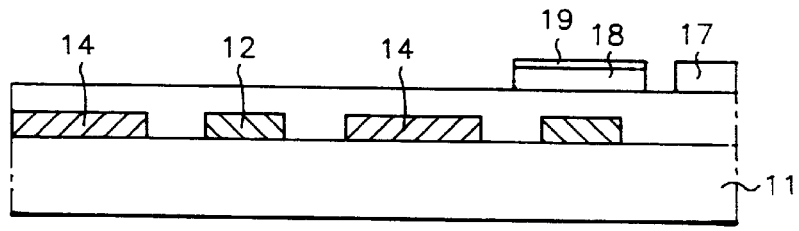

Next, as shown in FIG. 6D, a pixel electrode 17 is formed on a part of the insulation layer 15 spaced a certain distance from one side of the active layer 18 through forming a transparent conductive layer, such as an ITO(Indium Thin Oxide) on all over the exposed surfaces of the insulation layer 15, the active layer 18, and the high density semiconductor layer pattern 19, and subjecting it to a patterning.

Figure 6E:
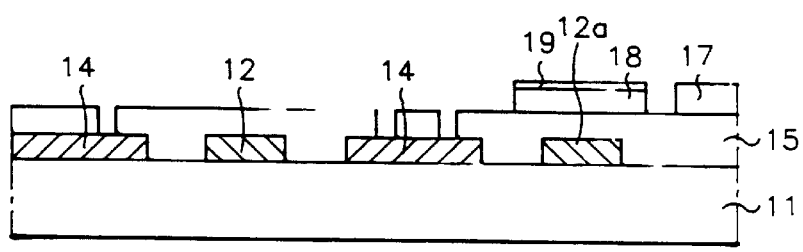
Figure 6F:
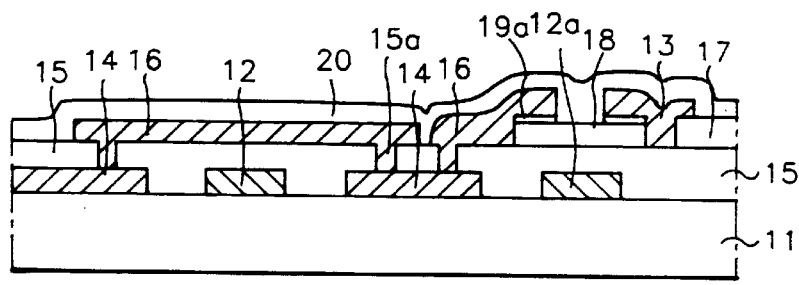

Then, as shown in FIG. 6E, one contact hole 15a is formed on each of the discrete edges of the second data line 14 on both sides of the gate line 12 at the crossing point by subjecting the exposed insulation layer 15 to another patterning process, again. Then, as shown in FIG. 6F, the first data line 13 as a drain electrode on an area extending from a part of one side of the active layer 18 to a part of the pixel electrode 17 together with the third data line 16 covering the other side of the active layer 18 and connecting the discrete second data line 14 by making contact with the contact holes on both sides of the gate line 12 at the crossing point, are formed through depositing metal on all over the exposed surface and subjecting it to a photo and an etching processes.

Herein, the second data line 14 and the third data line 16 serve as a source electrode.

Then, the ohmic contact layer 19a is completed by removing with etching the high density semiconductor layer pattern 19 exposed on the active layer 18 using the same mask used at forming the first and the third data lines 13 and 16.

Finally, an element protection insulation layer 20 is formed on all over the exposed surfaces of the first data line 13, the third data line 16, the insulation layer 15, and the active layer 18.

As can be seen, this invention has following advantages.

First, the vertical cross talk can be reduced because the factual data line, i.e., the second data line 14 is formed on the same layer, i.e., on the same height with the gate line 12, and the pixel electrode 17 is formed on the other layer, i.e., at lower height.

Second, the horizontal cross talk as well as degradation of image quality can be prevented because a capacitance caused by the same reason with the first one between the common electrode on the upper plate and the data lines on the lower plate can be reduced.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a thin film transistor liquid crystal display comprising steps for:

forming gate lines each having a projection part together with second data lines each crossing the gate lines at a right angle at parts other than the projection parts but having discrete edges at the crossing points through depositing metal on a transparent substrate and subjecting it to a patterning;

forming an insulation film on an entire exposed surface after forming the gate lines;

forming a semiconductor layer for forming an active layer and a high density semiconductor layer for forming an ohmic contact all over the exposed surface;

forming an active layer and a high density semiconductor layer pattern on each part of the insulation layer over every projection part by subjecting the two semiconductor layers to a patterning together;

forming pixel electrodes one each on a part of the insulation layer spaced a certain distance from one side of the active layer through forming a transparent insulation layer all over the exposed surface, and subjecting it to a patterning;

forming one contact hole on said discrete edges of the second data lines on both sides of the gate lines at the crossing points by subjecting the exposed insulation layer to a patterning process;

forming first data lines as drain electrodes each one on an area extending from a part of one side of the active layer to a part of the pixel electrode together with third data lines each one covering the other side of the active layer and connecting the discrete second data lines by making contact with the contact holes on both sides of the gate lines at the crossing point through depositing metal all over the exposed surface and subjecting said metal to a patterning using a mask;

forming ohmic contact layers by removing the high density semiconductor layer pattern exposed between the first and the third data lines using the mask used for forming the first and the third data lines; and, forming an element protection insulation layer all over the exposed surface after exposing the ohmic contact layers.

2. The method for fabricating a thin film transistor liquid crystal display as claimed in claim 1, wherein the high density semiconductor layer is an n conduction type.

* * * * *